United States Patent [19]
Schwartz

[11] Patent Number: 5,359,374
[45] Date of Patent: Oct. 25, 1994

[54] TALKING PICTURE FRAMES

[75] Inventor: Jeffrey M. Schwartz, San Clemente, Calif.

[73] Assignee: Talking Frames Corp., San Clemente, Calif.

[21] Appl. No.: 51,638

[22] Filed: Apr. 22, 1993

Related U.S. Application Data

[63] Continuation-in-part of Ser. No. 990,593, Dec. 14, 1992.

[51] Int. Cl.$^5$ .................. G03B 17/24; A47G 1/06
[52] U.S. Cl. ............................ 354/76; 40/152.1
[58] Field of Search .................. 354/175, 76, 106; 40/152.1, 906

[56] References Cited

U.S. PATENT DOCUMENTS

| | | | |
|---|---|---|---|
| 3,691,312 | 9/1972 | Petersen | 179/100.27 |
| 3,857,191 | 12/1974 | Sadorus | 360/2 |
| 4,222,188 | 9/1980 | Tarrant et al. | 40/152.1 |
| 4,318,188 | 3/1982 | Hoffmann | 40/124.1 |
| 4,389,541 | 6/1983 | Nakano et al. | 179/1 SM |
| 4,541,188 | 4/1985 | Sadorus | . |
| 4,602,296 | 7/1986 | Murakoshi | 360/10.1 |
| 4,611,262 | 9/1986 | Galloway et al. | 361/421 |
| 4,636,881 | 1/1987 | Brefka | 360/74.1 |
| 4,791,741 | 12/1988 | Kondo | 365/45 |
| 4,809,246 | 2/1989 | Jeng | 434/317 |
| 4,905,029 | 2/1990 | Kelley | 354/76 |
| 4,983,996 | 1/1991 | Kinoshita | 354/76 |
| 4,990,092 | 2/1991 | Cummings | 434/317 |
| 5,045,327 | 9/1991 | Tarlow et al. | 381/51 |
| 5,247,126 | 9/1993 | Okamura et al. | 84/609 |

FOREIGN PATENT DOCUMENTS

3532259A1 3/1987 Denmark .

OTHER PUBLICATIONS

"Electronic Design", Jan. 31, 1991.
"Products of the Year Awards", reprinted from Electronic Products, Jan. 1992.
ISD, Introduction to DAST, May 1992.
5 Lexis/Nexis Printouts (Patents not ordered).

Primary Examiner—Michael L. Gellner
Assistant Examiner—Nicholas J. Tuccillo
Attorney, Agent, or Firm—Knobbe Martens

[57] ABSTRACT

A still video image is placed within a frame or plaque and an associated audio stimulus is stored on a recording and playback unit. The recording and playback unit is self-contained and affixed to the frame to allow for instant and repeated playback of the audio stimulus when desired. Both the video image and the audio stimulus can be varied according to a user's desire. The portability of the frame and the recording and playback unit allow a user to record any audio event at the location and time that it occurs.

23 Claims, 9 Drawing Sheets

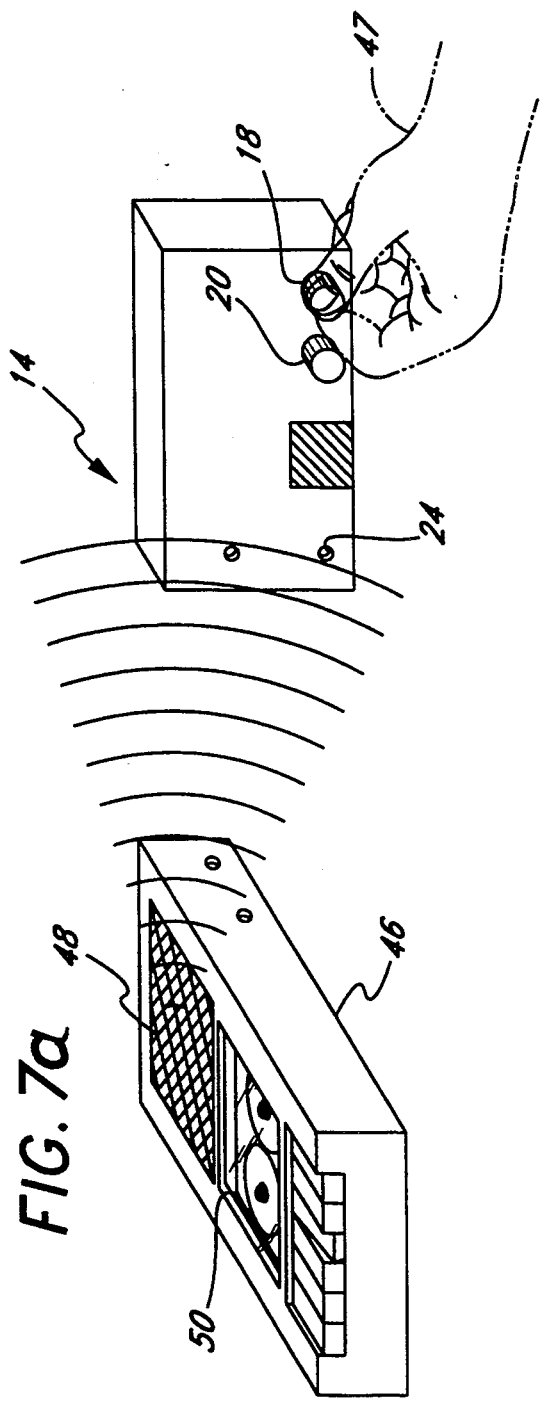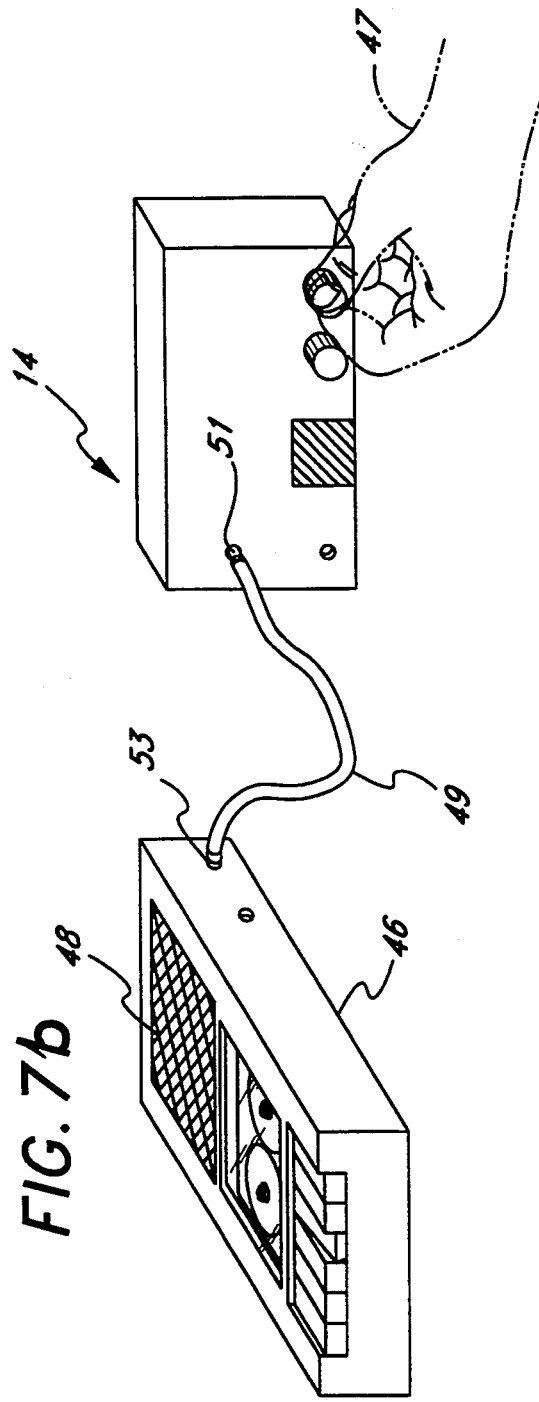

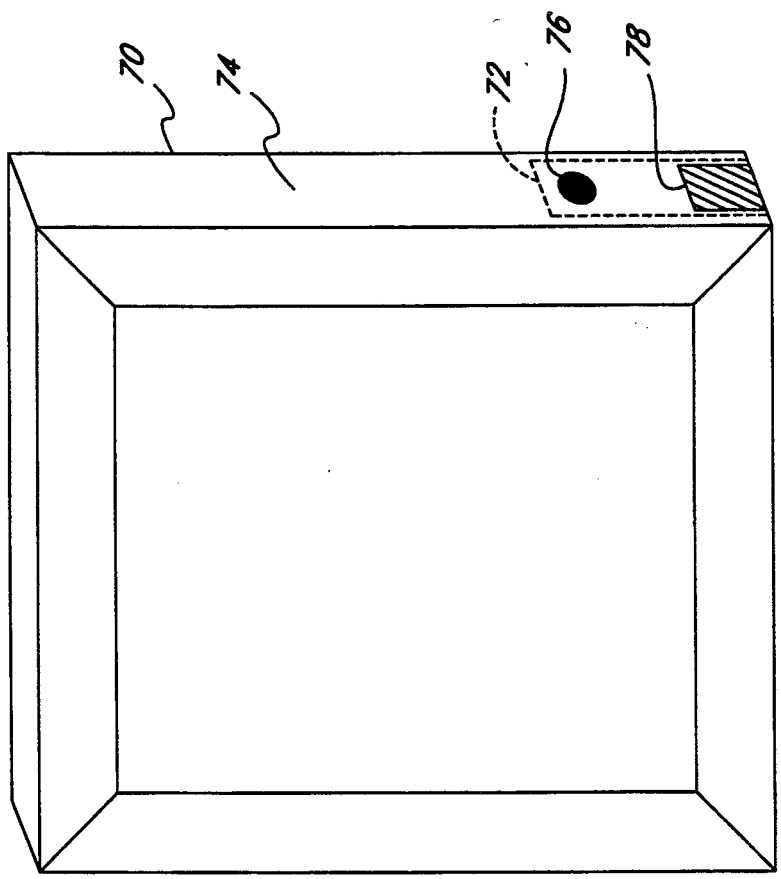
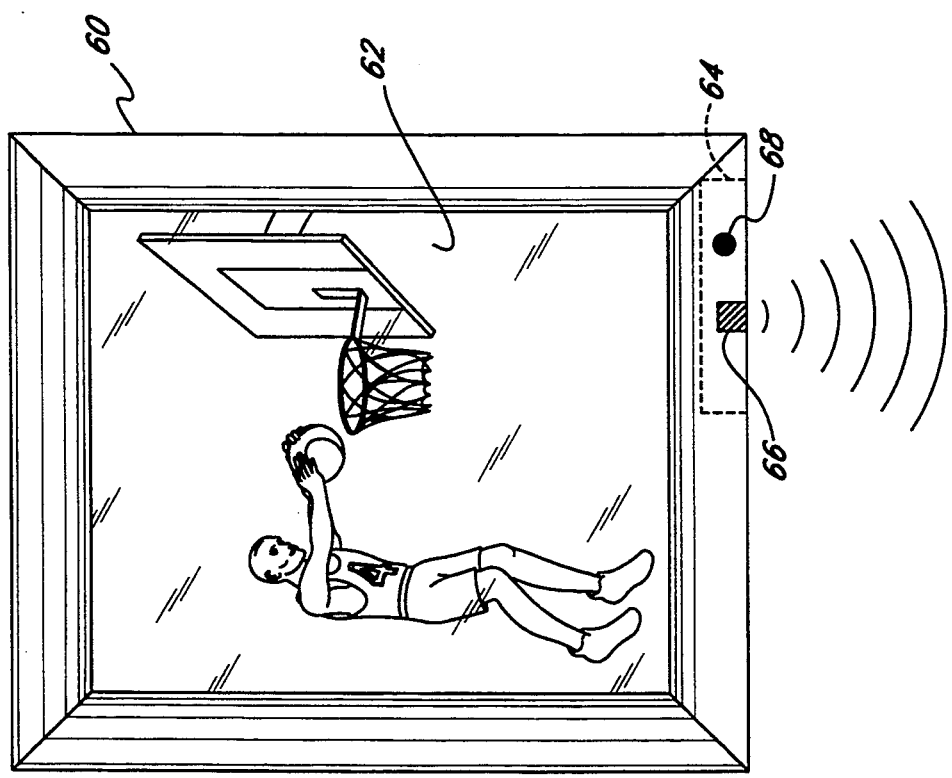

TALKING PICTURE FRAMES

This application is a continuation-in-part of application Ser. No. 07/990,593, filed Dec. 14, 1992, which is still pending.

FIELD OF THE INVENTION

The present invention pertains generally to the fields for storing visual and audio data and more particularly to picture frames or plaques that provide an audio aspect associated with a picture displayed in the picture frame or plaque.

BACKGROUND OF THE INVENTION

With the advent of technology there are many devices currently on the market for recording and playing back an audio and visual scene of a certain event. For example, home video recording machines provide the user with an opportunity to permanently record events that may otherwise exist only in still picture form or within someone's memory. To view the audio and visual recordings from these machines, one must replay the recording on a monitor. This method for viewing recorded scenes requires a certain amount of setup time, not to mention expensive video components, to begin viewing. These recorded scenes are thus not easily portable and are not always readily available for viewing. Often it is desirable to have continuous and instant viewing of certain memorable scenes. This is of course why particular pictures that may be especially pleasing or historic are often placed within a picture frame and mounted on a wall or placed on a shelf for long-term display. In this manner visual gratification is both instantaneous and continuous. In addition, still pictures placed within a frame provide a degree of transportability, or portability, not available with other means of recorded images. However, displaying such a picture along with an accompanying audio enhancement can be more desirable and effective at stimulating the memorable aspects of a picture without sacrificing the picture's portability.

U.S. Pat. No. 4,809,246 issued to Jeng, et al. discloses a sound illustrated book containing various audio sounds corresponding to the printed matter found on the pages of the book. Photosensitive elements determine which page of the book is opened for viewing in order to select the particular sound portion associated with the page. Another patent which discloses a sound illustrated book is U.S. Pat. No. 4,990,092 issued to Cummings. In Cummings, a book is described having a self-contained power source and voice chips which are activated by depressing a mark on a given page. The audio unit produces synthesized sound corresponding to the words or pictures on the page. Both of these devices disclose audio enhanced books employing separate and distinct methods for selecting and playing the correct audio signal associated with a given portion of the book.

Still another talking or sound-illustrated book is disclosed in U.S. Pat. No. 4,636,881 issued to Brefka, et al. In Brefka, logical circuitry is used in conjunction with an infrared detecting means to generate start and stop signals corresponding to the turning of pages. These start and stop signals are then used to access audio information pertaining to a particular page of the book that may be open. A cassette recorder is used for playing the prerecorded information corresponding to an open page.

U.S. Pat. No. 4,905,029 issued to Kelley discloses an audio still camera system incorporating a specialized camera capable of recording both a photographic image and an associated audio signal. The camera uses a specialized photographic film having an integral acoustic recording medium. The sound recorded on the medium is that created during the time period in which the picture was taken. Playback of the audio portion of the photograph is accomplished by insertion of the photograph into either the camera itself or into a separate playback means.

In the disclosure of the now withdrawn U.S. Pat. No. 5,045,327 issued to Tarlow, et al., there is shown a digital recording and playback module system. Specifically, Tarlow shows a recording center used to permanently record an audio message onto a playback module containing a digital memory. The playback module can then be attached to one of several items including a picture to provide an audio component. The device disclosed in Tarlow requires the use of a cumbersome and relatively complex recording center and does not provide a method for creating a self-contained, audio-enhanced picture that is reusable. Furthermore, the invention described in Tarlow mandates that the recording take place at the time and location of the purchase. This requires that a live audible event be staged at the recording center, which eliminates any spontaneity associated with the recording, or that a prerecorded message be played, which leads to signal degradation.

Even in light of the attempts made in the prior art to combine the recording aspects of video and audio, there is no unitary device which provides a portable and reusable method for recording and playing an audio passage, or other sound segment associated with a still picture. Accordingly, there is a need for a self-powered talking picture frame or plaque containing an integral audio recording and playback device for use in enhancing a still video image.

SUMMARY OF THE INVENTION

The drawbacks that exist in the prior art as discussed above have been overcome by the present invention through the use of a portable, self-powered and self-contained recording and playback device integrally mounted within a picture frame or plaque to provide an audio enhanced visual image.

In accordance with the present invention a talking picture frame or plaque is disclosed containing a frame having a section for accommodating a picture, and a self-contained recording and playback device for storing and playing an audio event associated with the picture. Also in accordance with the present invention, a method is disclosed for creating a talking picture frame or plaque allowing a user to vary the recording associated with the attached picture and repeatedly play the recording.

A picture frame or plaque is first provided having an area adapted for mounting a recording and playback device. Attached to the picture frame is the recording and playback device which is a self-contained unit having a non-volatile memory. This device allows the user to record an audio sample and replay the sample repeatedly without degradation of the recording. The device is also completely portable which enables the recording to be made wherever an audio event is taking place. A picture associated with the audio sample is provided by the user and mounted within the picture frame or plaque to provide both audio and visual stimulation. The present invention allows replacement of either the picture, the associated audio sample or both, depending on the user's desire.

In an alternative embodiment of the present invention, a playback device having a recording is mounted to the picture frame or to the plaque. The recording of this embodiment will have been made prior to retail sale and will not be erasable by a user. This recording for the alternative embodiment will be intended for use throughout the life of the picture frame. Also mounted to the frame is a picture associated with the recorded event. The picture is intended to remain in the frame or plaque throughout the life of the product but is nevertheless removable to accommodate the needs of a user. This allows a purchaser to acquire from a retailer an audio enhanced picture that might not otherwise be obtainable personally. The purchaser may then repeatedly initiate playback of the recorded event by simply pressing a playback activation switch.

Another embodiment of the invention allows the recording and playback device to accommodate both a rerecordable audio event which a user may vary and a permanent recording made during manufacture which a user will not ordinarily be able to change. The two separate recordings are allocated sequential memory space, and when playback of the recording and playback device is initiated, the permanent and rerecordable segments are played as a single continuous audible segment.

These and other objects and features of the present invention will become more fully apparent from the following description and appended claims taken in conjunction with the accompanying drawings.

BRIEF DESCRIPTION OF THE DRAWINGS

FIGS. 7a and 7b depict methods for recording a past event for use in a talking picture frame.

FIG. 8 depicts an alternative embodiment of a talking picture frame in accordance with the present invention.

FIG. 9 depicts an alternative embodiment of the present invention having the playback device mounted in the side of the picture frame.

DESCRIPTION OF THE PREFERRED EMBODIMENT

Reference is now made to the drawings wherein like numerals refer to like parts throughout.

Figure 1:
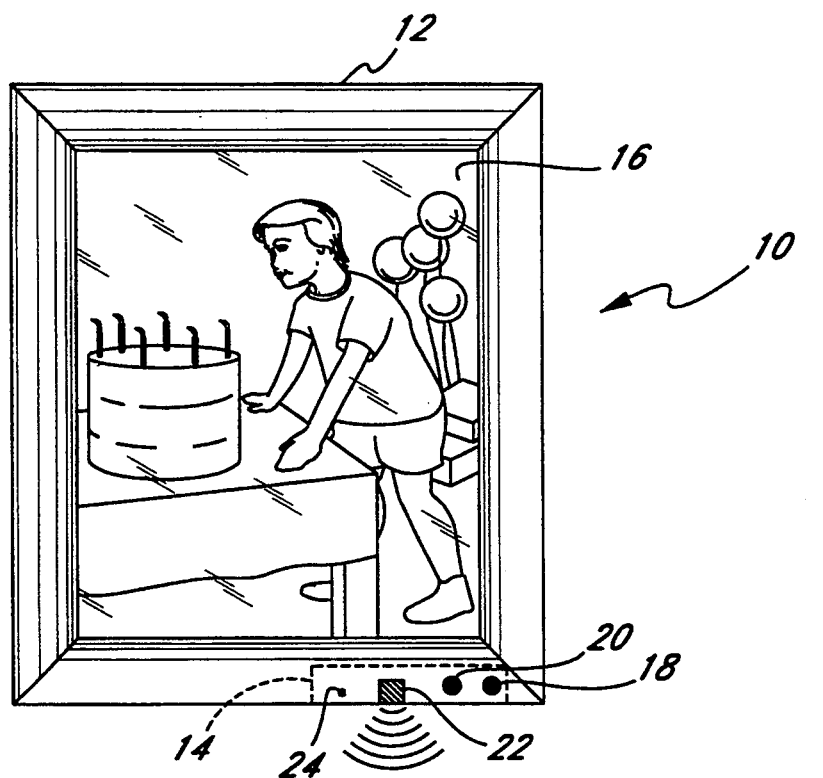
FIG. 1 depicts a reusable talking picture frame in accordance with the present invention.

FIG. 1 illustrates an overall view of a talking picture frame in accordance with the present invention. The present invention, shown generally as 10, contains a frame or plaque 12 in which is mounted either a painting or picture 16 and a recording/playback device 14 (shown in phantom). Attached to device 14, and bounded by a portion of frame 12, is a recording activation switch 18 and a playback switch 20. Also part of device 14 and seen from the front of frame 12 are a microphone 24 and a speaker 22.

Figure 2:
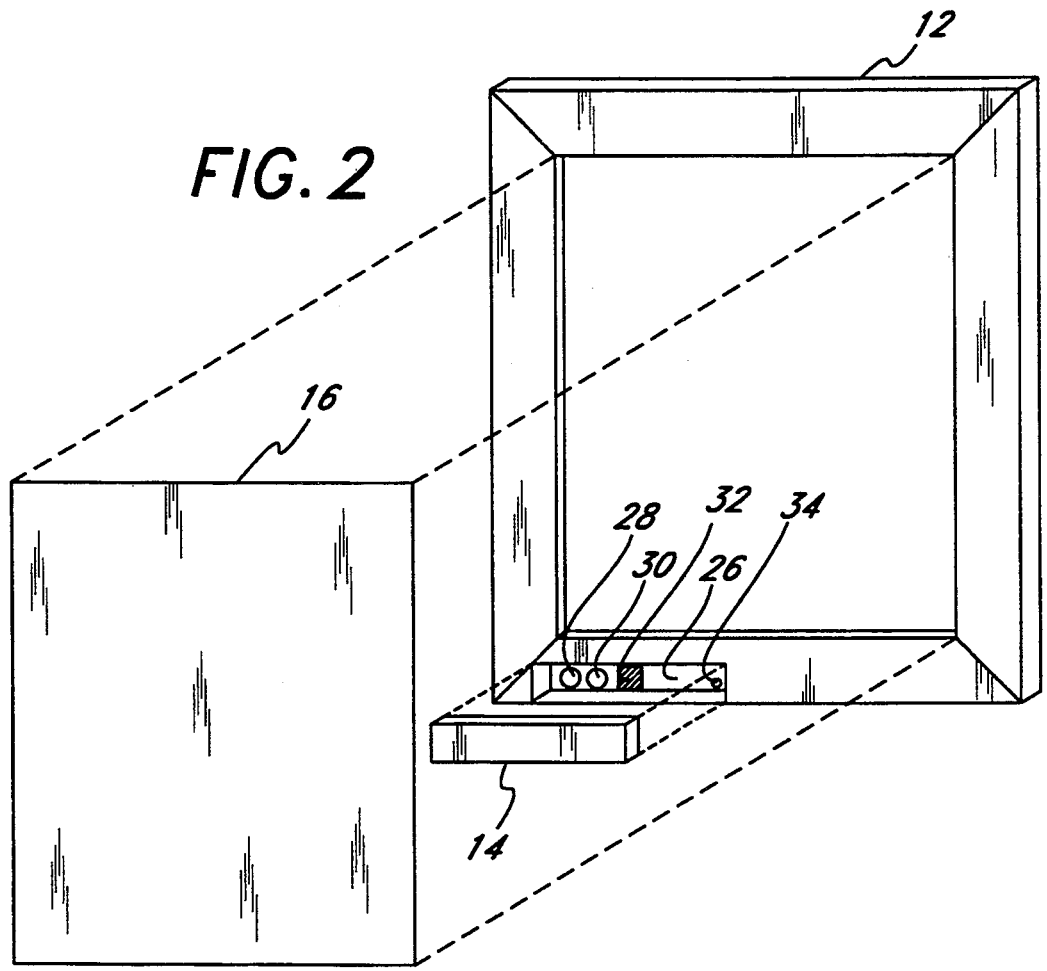
FIG. 2 is a rear exploded view of a talking picture frame.

FIG. 2 depicts a rear view of the present invention to demonstrate the removable aspect of both picture 16 and recording/playback device 14. As shown, picture 16 fits within frame or plaque 12 and may be replaced as needed depending on a user's desire. Frame 12 may of course be constructed of several sizes and shapes to accommodate various picture sizes.

Device 14 may also be repeatedly inserted and removed into a cutout 26 formed as part of picture frame 12. Although FIG. 2 shows the frame 12 with a rear cutout, the frame 12 may also be manufactured with a cutout accessible from the front so that device 14 may be removed without taking frame 12 off of a wall. Also shown in FIG. 2 are openings 28 and 30 for accommodating the record and playback switches of device 14. Similarly, apertures 32 and 34 accommodate the speaker and microphone of device 14, respectively.

Figure 3:
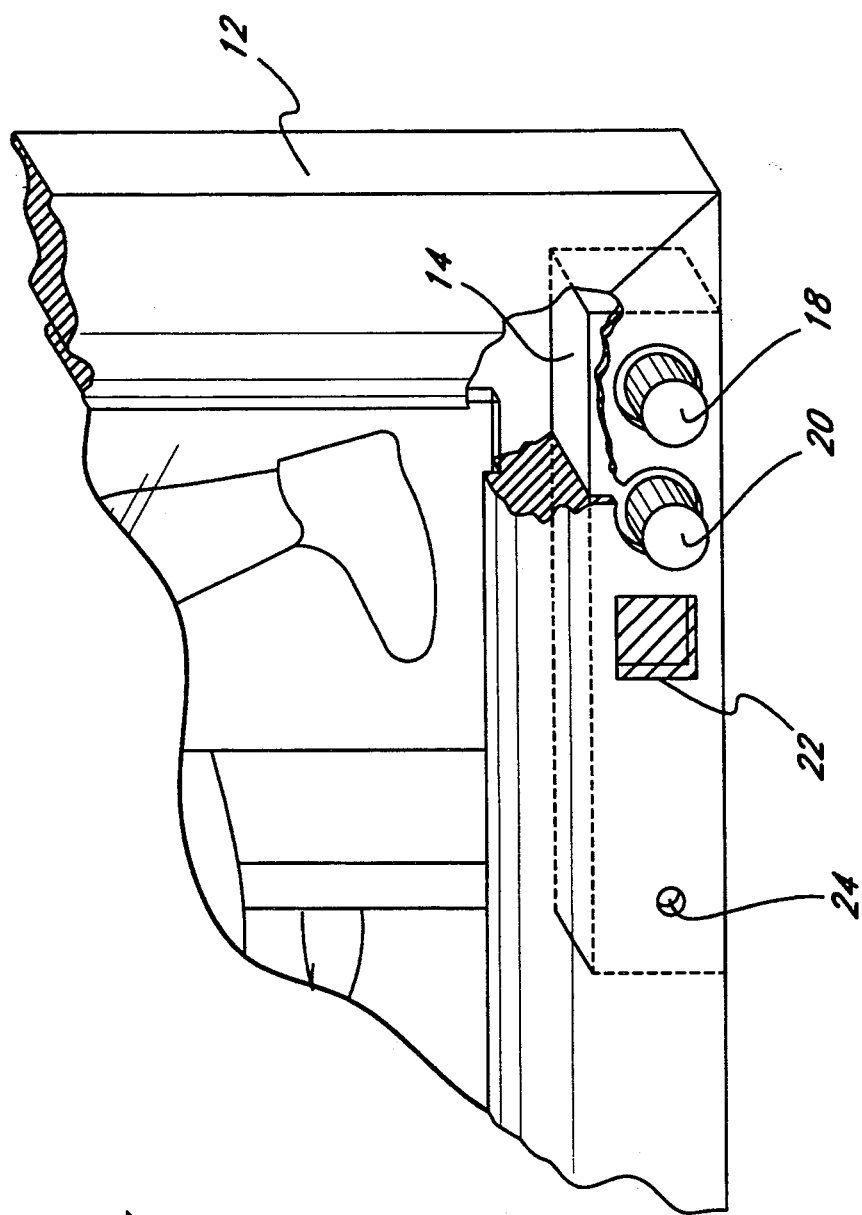
FIG. 3 is a close-up cutaway view of a talking picture frame and associated recording and playback device.

Placement of the recording/playback device 14 within frame 12 can best be seen in conjunction with FIG. 3. FIG. 3 depicts a cutaway view of a corner of frame 12. Placed within frame 12 is device 14 having switches 18 and 20, microphone 24 and speaker 22. The picture frame and the recording/playback device can be manufactured so that the device 14 is permanently attached to frame 12. Additionally, frame 12 can be made to allow for a removable recording/playback device 14 to allow for transportability of the device before recording and to allow for replacement of a defective recording device.

Although switches 18 and 20 are shown visually pronounced in FIG. 3, both switches, as well as microphone 24 and speaker 22, may be recessed within the frame 12 or they may be fabricated with the same texture as frame 12. Such camouflaging of device 14 will create an appearance that frame 12 is an ordinary frame, thus maintaining a high aesthetic quality. Alternatively, the recording/playback switches, microphone and speaker of device 14 could all be mounted towards the bottom, or side of the device and made to extend obscurely from either the bottom or side of the frame. Many such variations for mounting the device 14 may be employed without departing from the spirit of the invention.

Figure 4:
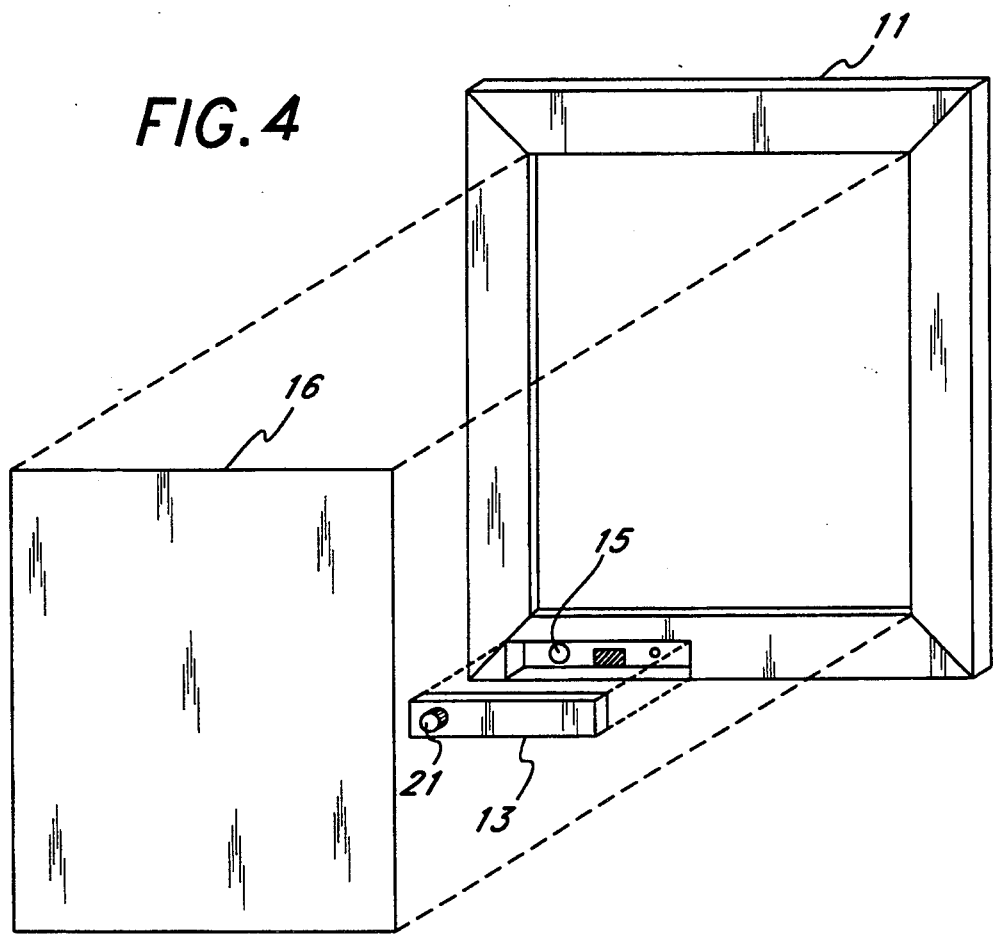
FIG. 4 is a rear exploded view of the present invention having the activation switches in a different configuration.

For example, FIG. 4 shows a rear exploded view of a different configuration of the present invention having a picture frame 11 and a device 13. The frame 11 has only one activation switch opening 15 to accommodate the playback switch (not shown). The recording activation switch 21 of device 13 is shown placed on the rear of the device to reduce the chance of inadvertently pressing the record button. With this configuration it would be desirable to have the activation switch recessed to make it difficult for a user, or the wall itself, to contact and activate the switch 21. Another method to prevent making an inadvertent recording on device 13 or 14 would require a user to press both play and record buttons to initiate a recording.

Figure 5:
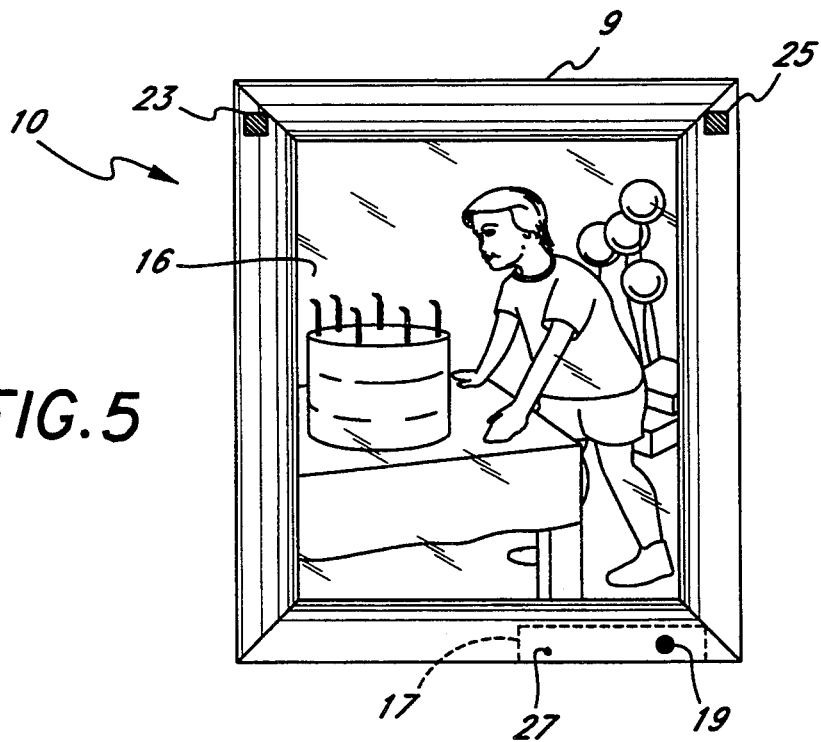
FIG. 5 is a front view of the present invention having the switch configuration of FIG. 4 and having dual remotely placed speakers.

Another variation of a reusable talking picture frame in accordance with the present invention is shown in FIG. 5. Specifically, there is shown a frontal view of a talking picture frame 9 having a record/playback unit 17. The unit 17 has a front mounted playback button 19, a rear mounted record button (not shown) and a microphone 27. Placed at opposite top corners of the picture frame 9 are speakers 23 and 25. Speakers 23 and 25 will be electrically connected to unit 17 to provide a higher level of sound quality.

Aside from the variations in placement and external structure just discussed, a recording and playback device for use in this invention may be made in accordance with one of several embodiments that incorporate different circuits designed to alter the way in which the audio message is presented. In particular, the present invention details three separate embodiments, shown in FIGS. 6a, 6b, and 6c, for the recording and playback device which affect the amount and position of memory space that is allocated for recording by a user.

For example, in one embodiment the entire memory of the recording and playback device is devoted to a user message while in the other two embodiments only a portion is devoted to the user message. In these latter embodiments, a portion of memory is permanently devoted to a preset message which is not readily altered by a user. The specific location in memory where the permanent message is stored depends upon the particular embodiment chosen.

Figure 6A:
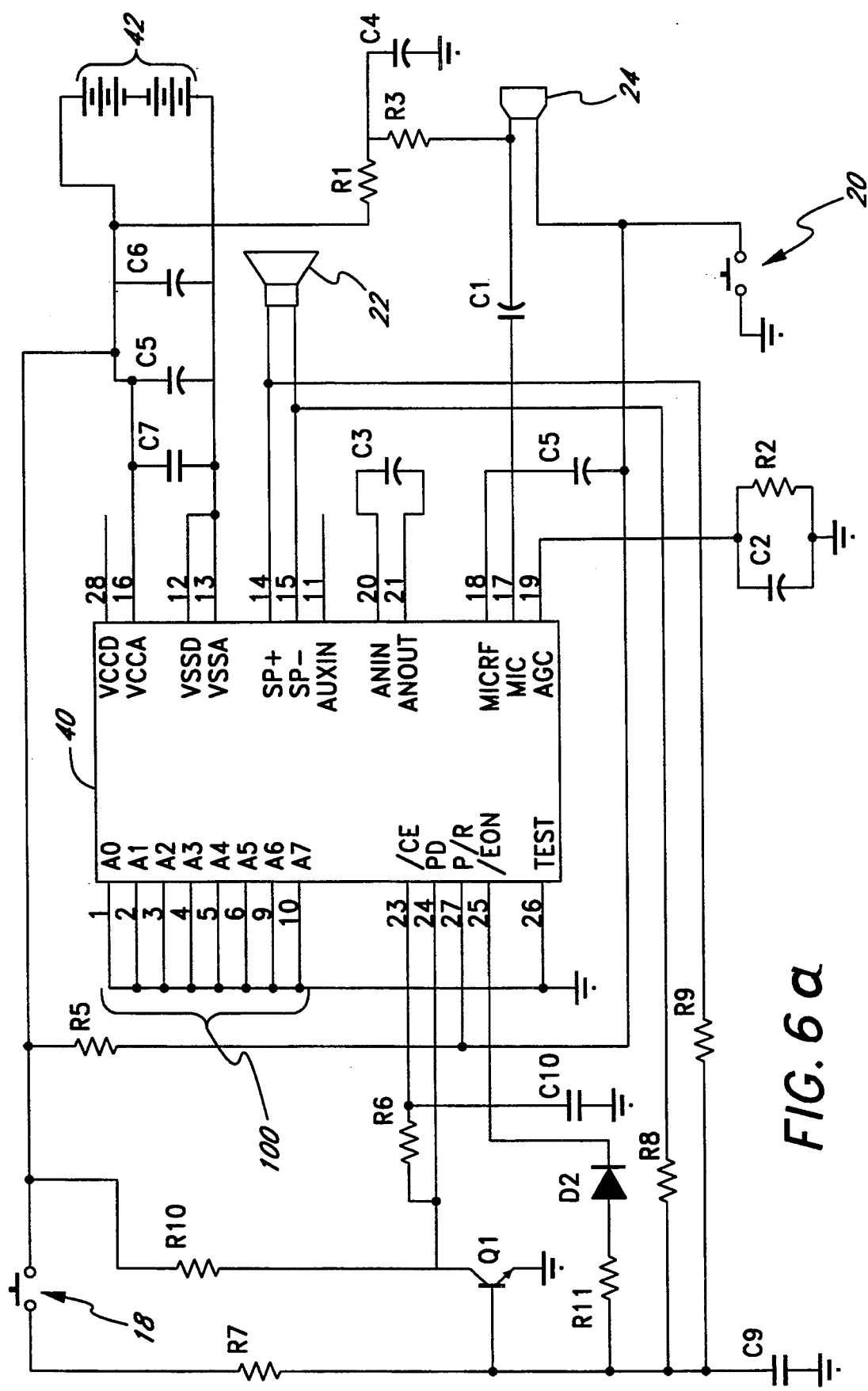
FIG. 6a is a schematic representation of a recording and playback device for use in the present invention.
Figure 6B:
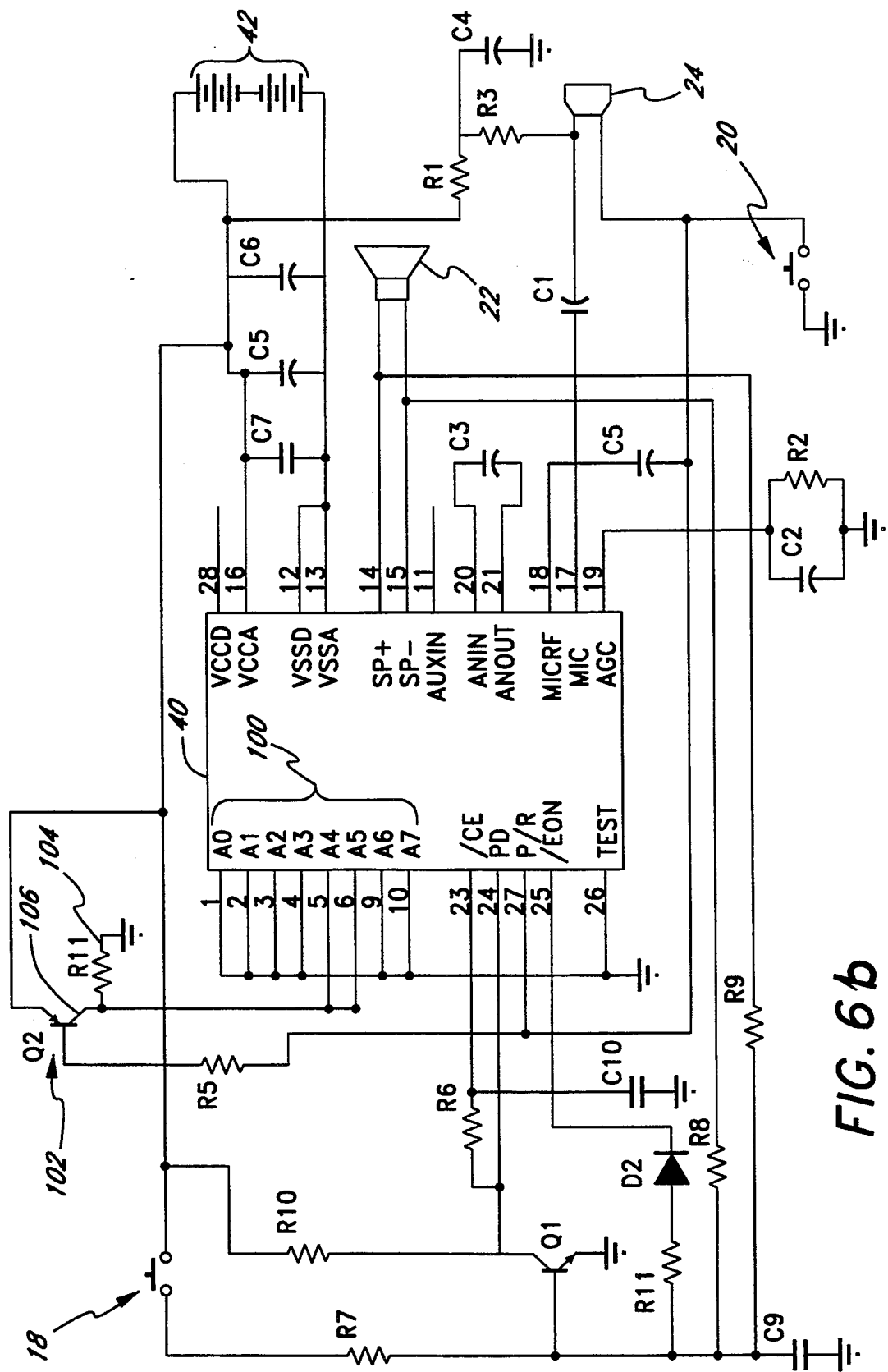
FIG. 6b is a schematic representation of a recording and playback device allowing a permanent segment of a message to be played from memory before a rerecordable segment is played.
Figure 6C:
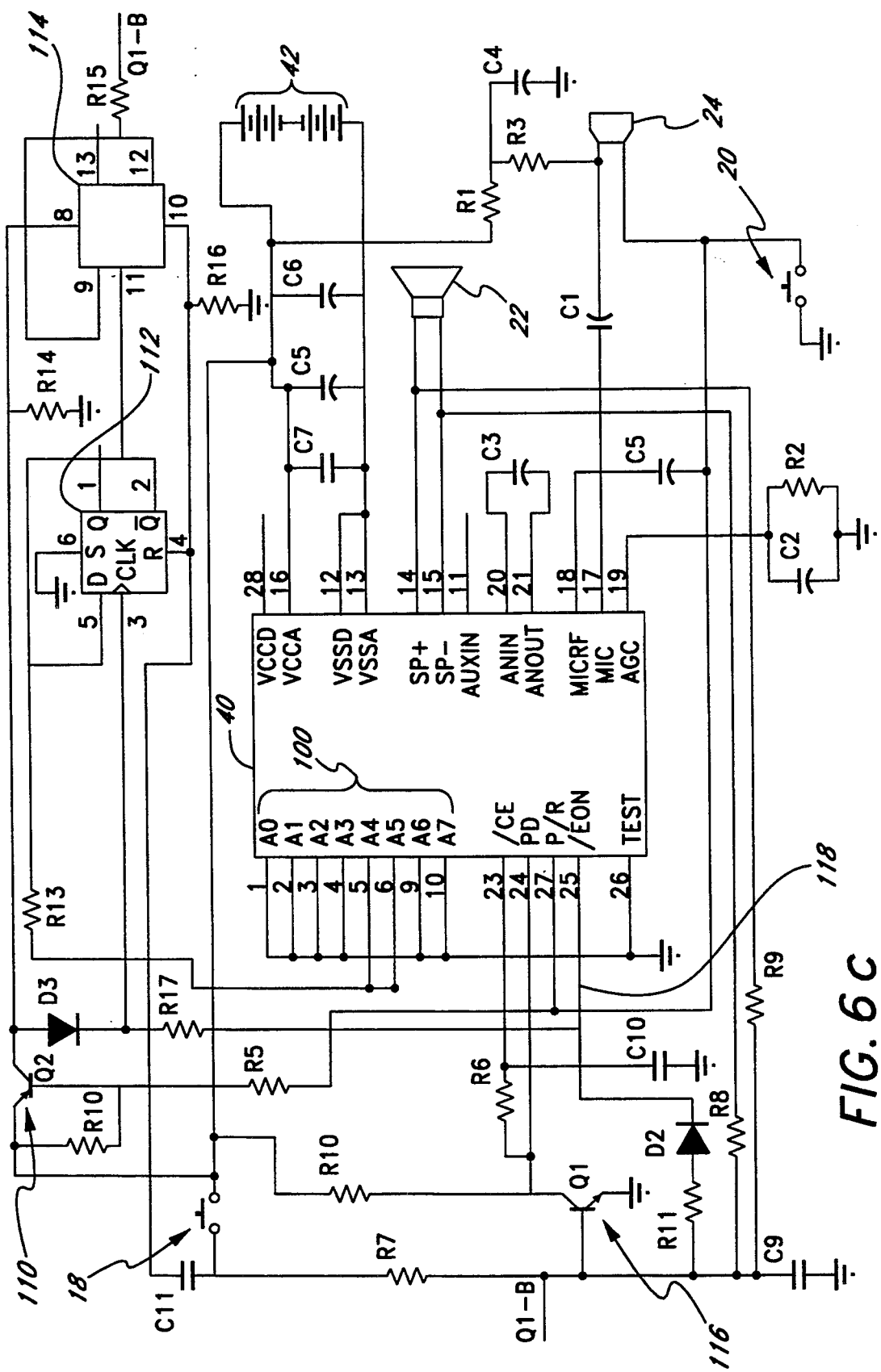
FIG. 6c is a schematic representation of a recording and playback device allowing a permanent segment of a message to be played from memory after a rerecordable segment is played.

The three embodiments shown in FIGS. 6a, 6b and 6c depict various circuits of recording and playback devices that may be used in accordance with the present invention. Each of the circuits shown in FIGS. 6a, 6b and 6c uses an analog solid state memory chip 40 which may be purchased from a commercial manufacturer. The particular chip used in the present invention is made by Information Storage Devices and is sold as model number ISD1016. This chip has a nonvolatile memory which will maintain the audio recording should power to the chip ever be interrupted.

Shown in schematic form, for all three circuits, and electrically connected to chip 40 are the speaker 22, the microphone 24, the record activation switch 20 and the playback activation switch 18. In order to provide a portable self-contained unit, the recording and playback devices shown in FIGS. 6a, 6b and 6c also have an internal DC power supply 42.

A first embodiment for a circuit of a recording and playback device, that allocates the entire memory space to a user for recording, is shown in FIG. 6a. This circuit includes several other common electronic components which are connected as shown. Although FIG. 6a depicts a particular recording and playback circuit using an ISD1016 chip, similar circuits which perform the same function can be engineered having different components and different characteristics.

The particular ISD1016 chip used in the present invention has a quantity of memory space which can be accessed at various locations within the memory according to the settings, or voltage levels, placed on a set of eight address lines 100. The position in memory corresponding to a particular setting for the address lines can be determined by reference to the design manual accompanying the ISD1016 chip. Three, of many possible circuits are disclosed, which control the amount and location of memory allocated to the user for storage of an audio segment.

Specifically, the circuit of FIG. 6a allows a user to repeatedly record a message on the chip 40 using the entire memory available, which is approximately sixteen (16) seconds. The user may then replay the message at any time by depressing a playback activation switch represented by the circuit component 18. In FIG. 6a, all eight of the address lines 100, which dictate the location in memory where recording or playback of a message will commence, are connected to ground potential. Connecting all of the address lines 100 to ground starts the recording or playing of any message at the beginning of memory in the chip 40.

A significant feature of this invention is the ability to control the operation of the address lines 100 through circuit operations and user interaction. This control over the address lines 100 will affect the location in memory where recording and playback will commence.

Two alternative embodiments for controlling the address lines 100 and consequently controlling memory allocation are shown in FIGS. 6b and 6c. These figures depict schematic diagrams of circuits which selectively control the status of the address lines in conjunction with the activation of the play and record switches. The circuit of FIG. 6b allows a permanent message to be placed within chip 40 at the beginning of memory, while allowing a user to place their own personal message at the end of the permanent message. Upon playback, both the permanent message and the user's rerecordable message will be played in sequence. Similarly, FIG. 6c discloses a circuit for placing a permanent message at the end of the memory within chip 40, and placing the user's message at the beginning of memory. Again, both messages are played in sequence upon playback.

In addition to the circuit components shown in FIG. 6a, the embodiment of FIG. 6b contains a second transistor 102 along with a biasing resistor 104. As shown in FIG. 6b, the collector 106 of transistor 102 is connected to two of the eight address lines 100. Upon activating the record switch 20, the address lines connected to the collector 106 will be set at a positive voltage level, i.e. they will be pulled "high," by operation of the transistor 102. Commencement of recording by the user will thus begin at the memory location dictated by the address line setting. In this manner, the recorded audio segment stored at the beginning of the memory is permanent in the sense that it cannot be readily altered by a user.

During playback, the transistor 102 is not operative and all of the address lines 100 are therefore connected to ground. As a result, playback begins from the first memory location which is where the permanently stored message is located. Of course, the length of the permanent message may be varied by simply connecting the appropriate address lines to collector 106 to correspond to the desired memory location. As mentioned previously, this information is available from the design manual of the ISD1016 chip which is herein incorporated by reference.

The embodiment of FIG. 6c discloses a circuit representing a recording and playback device capable of playing a permanent audio segment after playing a user's rerecordable audio segment. The circuit of FIG. 6c employs a transistor 110 and a pair of flip-flops 112 and 114 to control the sequence for recording of the user's message (rerecordable audio segment), and the sequence for playing back both messages upon demand. The various address lines 100 are controlled by flip-flop 112 in response to inputs generated as a result of activating playback switch 18, and in response to input signals received from the end-of-message output 118 of chip 40. Flip-flop 114 provides base current to forwardly bias resistor 116 and fully enable the circuit shown in FIG. 6c. Because the clock input to flip-flop 114 is connected to the output for flip-flop 112, the current state of flip-flop 114 is dependent upon the state of flip-flop 112. The interaction of the flip-flops 112 and 114 with the end-of-message signal 118 and the address lines 100, enable a user to access only a beginning portion of memory. Again, the exact amount of memory allocated to the user can be varied by wiring particular address lines to flip-flop 112 as desired.

The ability to store a permanent audio segment along with a rerecordable segment enhances the functionality of the talking picture frame and makes the frames more marketable. For example, having a permanent segment provides an opportunity to use the permanent segment as a means of advertisement or as a message that is interactive with the user's message. Although FIGS. 6a, 6b and 6c disclose three circuits for employing a recording and playback circuit, there are many more variations which are possible without deviating from the spirit of the invention. For example, it is possible that two permanent segments may be placed within the memory of chip 40, one at each end, while maintaining the center of memory for a rerecordable segment.

The recording and playback devices of FIGS. 6a, 6b and 6c are shown with only one memory chip 40. Currently, chip 40 will provide approximately sixteen (16) seconds of audio data. The present invention envisions providing a recording and playback device that can be expandable to accommodate a plurality of chips 40 to increase the length of the recorded segment.

To operate the disclosed invention, an audio sample will be recorded onto the recording and playback device by a user, and more specifically within chip 40 represented in FIGS. 6a, 6b or 6c. The length of the audio sample and the position in memory where it is stored may vary depending on which recording and playback circuit is employed. As can be appreciated, each of the device configurations 13, 14 or 17 may contain any one of the recording and playback circuits shown in FIGS. 6a, 6b or 6c.

The audio sample is recorded by the user, depending upon the configuration used, by positioning one of the devices 13, 14 or 17, within audible range of the event to be recorded. For example, this may be accomplished either by transporting picture frame 12 and device 14 as a single unit, or more simply by only transporting device 14 after removal from frame 12.

Figure 7C:
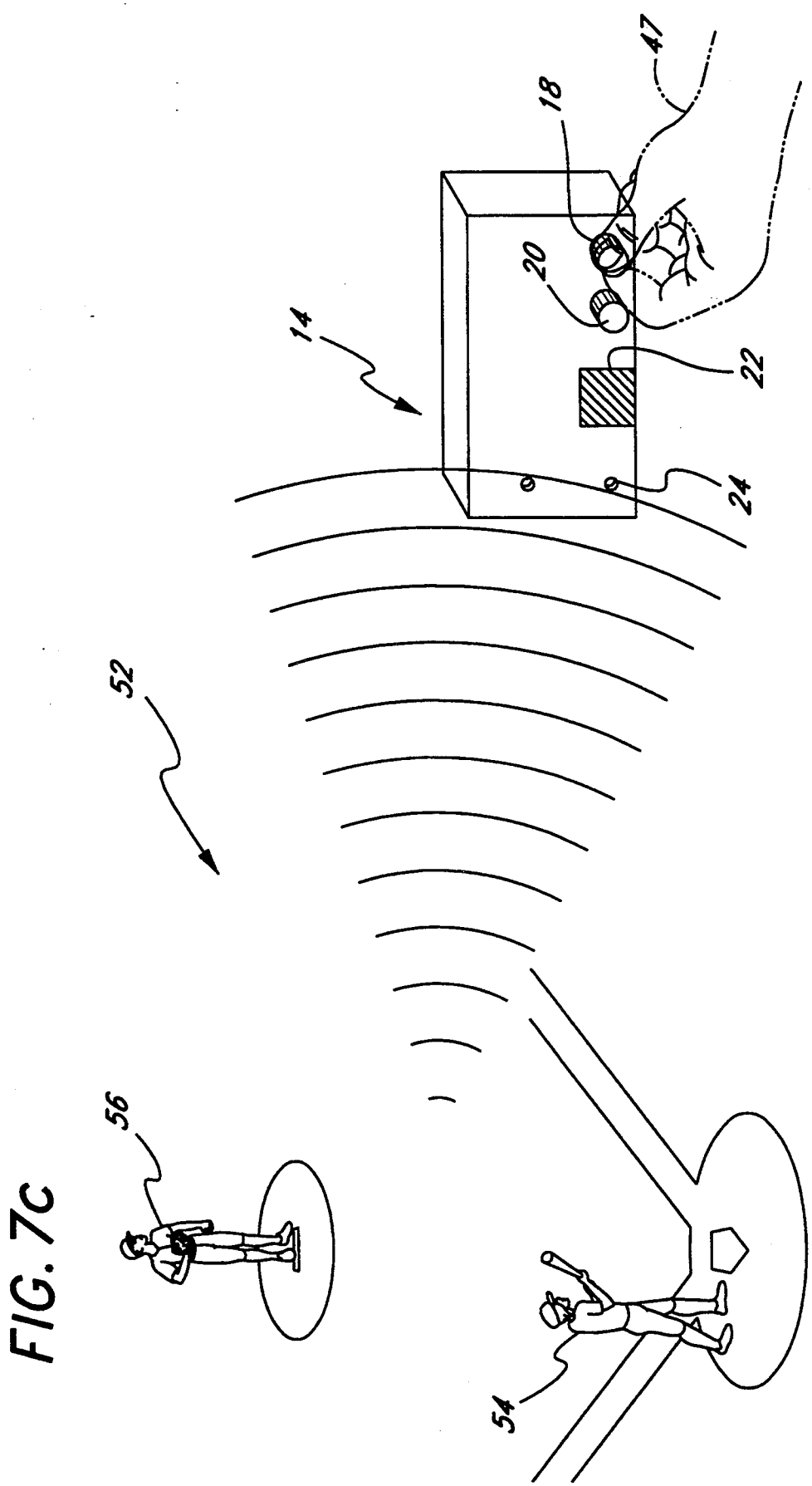
FIG. 7c depicts a method for recording a present event for use in a talking picture frame.

FIGS. 7a, 7b and 7c depict methods for recording, onto device 14, either a past event that has been previously recorded, or a present ongoing event. FIG. 7a depicts a common recording and playback device 46 that uses a magnetic tape 50 to store a representation of sound. To record a segment off of tape 50 and into device 14, device 14 may be placed near recorder 46 as shown in FIG. 7a. Once recorder 46 begins playing, a user 47 depresses or turns recording switch 18, depending on the type of switch employed. This will in turn enable microphone 24 to electronically sense, and chip 40 to electronically record, the sound emanating from speaker 48. It can be easily understood that device 14 could record from any device, such as a home video camera, home stereo system, a home videocassette recorder (VCR), or any device that is capable of producing an audible sound.

Referring now to FIG. 7b, there is disclosed an alternative method for recording onto device 14. To avoid interference from unwanted sound airwaves and to generally improve the quality of the sound recording onto device 14, a jumper wire 49 may be connected to an output jack 53, commonly found in most recording units, to electronically transmit the audio signal to device 14 via an input jack 51. Because individual recording units may transmit audio signals at various recording levels, the jumper wire 49 or device 14 may include a recording level potentiometer, or similar device, to adjust the signal received by the device 14.

FIG. 7c depicts how the recording/playback device 14 would be used to record an audible segment of a present event. For example, a user may desire to record a portion of a special baseball game 52 where a batter 54 is about to swing at a pitch to be thrown by a pitcher 56. To record this event, a user may simply press activation switch 18 as shown, or both switches depending on the configuration employed, to begin recording at the desired moment.

The mobility of the present invention allows the recording unit to be placed at the scene of the event as it is happening. Previous inventions that make use of an audio recording to enhance a still picture require the use of a kiosk or a recording center. With these previous devices, either an original recording must be made at the location of the kiosk, or a second recording is made from a prerecorded event using the kiosk. The second recording is then used to add audio stimulation for a given picture. Use of these devices that employ kiosks, or other accessory hardware to make a recording, often necessitate recording from another recording rather than from the event itself. Accordingly, each successive recording that is required is inconvenient and leads to signal degradation and an inferior product. The present invention overcomes this drawback by incorporating a self-contained recording and playback device which is mounted within a picture frame or plaque. The recording and playback device may or may not be removable from the picture frame. In either event, the frame/-recorder combination, or just the recorder itself, is highly portable to allow transportation to, and recording of an audio event.

It can be appreciated that recording/playback device 14 need not be placed in a specially manufactured frame or plaque but instead may itself be manufactured to be directly attachable to any number of existing frames commercially available. This may require placing switches 18 and 20, microphone 24 and speaker 22 on a side surface of device 14 so that the switches are readily accessible after attachment to a commercially available frame. In this manner, a device 14 and a picture frame may be sold as a two-piece unit in retail outlets, or the recording unit may be sold separately.

Another alternative and highly practical embodiment of the present invention is shown in FIG. 8. Specifically, FIG. 8 shows an audio enhanced picture which is not reusable but is instead configured to semi-permanently display a well known or special event. FIG. 8 depicts a frame or plaque 60 in which a picture 62 is mounted. Picture 62 shows a basketball player making a jump shot which represents a key play from a famous sporting event. With the alternative embodiment, it is intended that picture 62 will remain mounted throughout the life of the frame 60 and device 64. However, it will be possible to remove the picture 62 for various reasons such as when a purchaser has a chance to obtain an autograph of the person shown in the picture.

The audio accompaniment to the event depicted in picture or plaque 62 is permanently recorded within a playback device 64 mounted within, or on, frame 60. In this embodiment, the user is not provided with means for recording over the audio accompaniment. Rather, to hear the audio portion of the event, a user would depress playback activation switch 68 and sound would be generated from speaker 66.

Using a smaller playback-only device 64 would reduce cost and allow for the sale of relatively inexpensive audio enhanced pictures. These pictures may include all types of newsworthy events such as famous moments in sports, famous political speeches, awards ceremonies, wildlife scenes or the like.

Again, to create the appearance of an ordinary picture and to maximize the aesthetic appearance of the invention, the alternative embodiment may be constructed as shown in FIG. 9. Specifically, a playback device 72 is placed within picture frame 70 so that the activation switch 76 and speaker 78 are disposed within a side portion 74 of frame 70.

Through the foregoing description and accompanying drawings, the present invention has been shown to have important advantages over previous attempts to audibly enhance a still picture. Specifically, the present invention uses a self-contained recording and playback device which is easily transportable enabling a user to personally record special events as they happen. An alternative embodiment creates a permanently enhanced picture of a well known, or otherwise generally appealing event.

While the above detailed description has shown, described and pointed out the fundamental novel features of the invention as applied to various embodiments, it will be understood that various substitutions and changes in the form and details of the talking picture frame and associated method illustrated may be made by those skilled in the art, without departing from the spirit of the invention.

What is claimed is the following:

1. A method for creating a reusable audio enhanced picture frame or plaque enabling a user to record and replay an audio event corresponding to a picture placed in said picture frame to increase the resulting informational content or enjoyment, and enabling a user to play a prerecorded message in sequence with said audio event to provide commercial or other information, wherein said method comprises the following steps:

providing a picture frame adapted for accommodating a self-contained recording and playback device;

providing a self-contained recording and playback device having a non-volatile solid state memory and attaching said device to said picture frame;

wherein said recording and playback device has a circuit for controlling the location in said memory where said audio event and said prerecorded message are stored;

permanently recording said prerecorded message at a first location within said self-contained recording and playback device wherein said prerecorded message is unalterable by said user;

combining said picture frame or plaque and said recording and playback device to create a portable assembly so that said present or past audio event is recordable at any remote location and at any time;

recording a present or past audio event at a second location within said self-contained recording and playback device by initiating a record sequence at a desired time;

providing a picture representing a memorable moment corresponding to said present or past audio event and removably mounting said picture within said picture frame;

displaying said picture and picture frame at a location within visual and audible range of a user; and playing said recorded audio event and said prerecorded message in sequential fashion and on repeated occasions by initiating a playback function on said recording and playback device to create an audio enhanced picture and to convey commercial or other information.

2. The method of claim 1 wherein following said initiation of said record sequence said audio event is placed in a location of memory by said circuit, enabling said audio event to be played before said prerecorded message is played upon initiation of said playback function.

3. The method of claim 1 wherein following said initiation of said record sequence said audio event is placed in a location of memory by said circuit, enabling said audio event to be played after said prerecorded message is played upon initiation of said playback function.

4. The method of claim 1 wherein said recording and playback device contains a microphone, audio storage means, playback means, control means, and a speaker.

5. The method of claim 1 wherein said recording and playback device is internally powered.

6. The method of claim 1 wherein said recording and playback device is removably attached to said picture frame to allow for transportation of said device and recording of said present event.

7. The method of claim 1 wherein the step of recording of said present audio event is accomplished in real time by transporting said picture frame to said present event.

8. The method of claim 1 wherein the step of recording a past audio event is created by playing a second recording of said past audio event while said recording and playback device is recording.

9. A display apparatus for providing both visual and audio stimulation to enhance the resulting informational content and reinforce in a user memorable moments represented by the visual and audio stimuli, said display apparatus comprising:

a frame or plaque for accommodating a picture to be provided by a user;

an audio recording and playback unit attached to said frame, said recording and playback unit having (A) a solid state memory for (i) storing and playing a rerecordable audio accompaniment to said picture for providing said audio stimulation wherein said audio accompaniment is stored at a first location within said memory, and (ii) storing and playing a permanent audio message, said permanent audio message being unalterable by said user to provide commercial or other information to said user and (B) a circuit coupled to said solid state memory for controlling access to said memory during playback and for affecting the location within said memory where said audio accompaniment and said permanent message are stored;

said display apparatus being portable to allow said user to transport said apparatus to an audio event and record said rerecordable audio accompaniment within said recording and playback unit without the use of a separate recording center;

a first activation switch coupled to said audio recording and playback unit for initiating recording of said audio accompaniment by said recording and playback device; and a second activation switch coupled to said audio recording and playback unit for initiating playback of said audio accompaniment and said permanent message resulting in an audio enhanced picture conveying memorable moments of said picture and conveying a valuable commercial or other message to a user.

10. The display apparatus of claim 9 wherein said circuit is configured to place said audio accompaniment and said permanent message at locations in said solid state memory enabling said audio accompaniment to be played before said permanent message is played.

11. The display apparatus of claim 9 wherein said circuit is configured to place said audio accompaniment and said permanent message at locations in said solid state memory enabling said audio accompaniment to be played after said permanent message is played.

12. The display apparatus of claim 9 wherein said audio accompaniment and said permanent message are played in sequence by said circuit upon initiation of said second activation switch.

13. The display apparatus of claim 9 wherein said audio recording and playback unit is self-contained within said frame.

14. The display apparatus of claim 9 wherein said audio recording and playback unit comprises a speaker or speakers which are remotely mounted within said frame.

15. The display apparatus of claim 9 wherein said audio recording and playback unit contains a microphone, a non-volatile memory, and an internal power supply.

16. The display apparatus of claim 9 wherein said solid state memory is expandable to lengthen the time available for recording of said audio accompaniment and said permanent audio message.

17. The display apparatus of claim 9 wherein said audio recording and playback unit is removably mounted to said frame to allow for transportation to said audio event and recording of said audio accompaniment.

18. The display apparatus of claim 9 wherein said audio recording and playback unit has an input jack for accepting an input electronic signal corresponding to said audio accompaniment.

19. The display apparatus of claim 9 wherein said display apparatus is electrically connected by a wire to a prerecorded signal corresponding to said audio accompaniment, and is connected to said wire for adjusting the recording level of said audio accompaniment.

20. The display apparatus of claim 9 wherein said activation switches are mounted on opposite sides of said recording and playback unit to inhibit inadvertent recording of audio data onto said recording and playback unit.

21. The display apparatus of claim 9 wherein said picture frame is formed with a recess to accommodate said audio recording and playback unit.

22. A display apparatus for providing both visual and audio stimulation to enhance the resulting informational content and reinforce in a user memorable moments represented by the visual and audio stimuli, said display apparatus comprising:

a frame or plaque for accommodating a picture to provide visual stimulation to a user;

an audio recording and playback unit attached to said frame, said recording and playback unit having (A) a solid state memory for (i) storing and playing a rerecordable audio accompaniment to said picture for providing a first part of said audio stimulus, and (ii) storing and playing a permanent audio message to provide a second part of said audio stimulus wherein said permanent audio message is unalterable by said user and (B) a circuit coupled to said solid state memory for controlling access to said memory during playback and for affecting the location within said memory where said audio accompaniment and said permanent message are stored; and said display apparatus being portable to allow said user to transport said apparatus to an audio event and record said rerecordable audio accompaniment within said recording and playback device without the use of a separate recording center.

23. A method for adapting a picture frame or plaque to be used as a talking picture frame or plaque to supplement the informational content of a picture mounted in said picture frame or plaque and to increase the enjoyment and memorable moments associated with said picture, said method comprising the steps of:

providing a commercially available picture frame or plaque;

providing a picture or painting to be mounted to said picture frame or plaque wherein said picture or painting has some special significance to a viewer;

providing a recording and playback device having an adapter for attachment to said picture frame or plaque, said recording and playback device having a first audio segment which is permanently stored at a first location within said recording and playback device, said first audio segment unalterable by said viewer;

recording a second audio segment at a second location within said recording and playback device by enabling a first activation switch of said recording and playback device, said second audio segment being a sample of an audible event or other sound;

attaching said recording and playback device to said picture frame or plaque with said adapter so that said recording and playback device is inconspicuous, and;

repeatedly playing said first and second audio segments recorded on said recording and playback device by enabling a second activation switch so that sound is generated through a speaker of said recording and playback device.

* * * * *